(12) United States Patent
Lee et al.

(10) Patent No.: US 10,763,340 B2
(45) Date of Patent: *Sep. 1, 2020

(54) GROWING GROUPS III-V LATERAL NANOWIRE CHANNELS

(71) Applicant: International Business Machines Corporation, Armonk, NY (US)

(72) Inventors: Sanghoon Lee, White Plains, NY (US); Effendi Leobandung, Stormville, NY (US); Renee Mo, Yorktown Heights, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/129,329

(22) Filed: Sep. 12, 2018

(65) Prior Publication Data

US 2019/0013393 A1 Jan. 10, 2019

Related U.S. Application Data

(63) Continuation of application No. 14/824,461, filed on Aug. 12, 2015, now Pat. No. 10,103,242.

(51) Int. Cl.
*H01L 29/66* (2006.01)
*H01L 29/06* (2006.01)
(Continued)

(52) U.S. Cl.
CPC ........ *H01L 29/66522* (2013.01); *B82Y 10/00* (2013.01); *H01L 21/0242* (2013.01); *H01L 21/0245* (2013.01); *H01L 21/02381* (2013.01); *H01L 21/02422* (2013.01); *H01L 21/02433* (2013.01); *H01L 21/02488* (2013.01); *H01L 21/02502* (2013.01); *H01L 21/02538* (2013.01); *H01L 21/02603* (2013.01); *H01L 21/02639* (2013.01); *H01L 21/02645* (2013.01); *H01L 21/26546* (2013.01); *H01L 21/3086* (2013.01); *H01L 21/30604* (2013.01); *H01L 21/30612* (2013.01); *H01L 21/30617* (2013.01); *H01L 21/7624* (2013.01); *H01L 29/045* (2013.01);
(Continued)

(58) Field of Classification Search
None
See application file for complete search history.

(56) References Cited

U.S. PATENT DOCUMENTS 8,084,337 B2 12/2011 Samuelson et al.
8,816,324 B2 8/2014 Fukui et al.
(Continued)

FOREIGN PATENT DOCUMENTS

CN 103311305 A 9/2013
CN 103346070 A 10/2013
(Continued)

*Primary Examiner* — Alexander G Ghyka
(74) *Attorney, Agent, or Firm* — L. Jeffrey Kelly

(57) ABSTRACT

In one example, a method for fabricating a semiconductor device includes forming a mandrel comprising silicon. Sidewalls of the silicon are orientated normal to the <111> direction of the silicon. A nanowire is grown directly on at least one of the sidewalls of the silicon and is formed from a material selected from Groups III-V. Only one end of the nanowire directly contacts the silicon.

12 Claims, 7 Drawing Sheets

(51) Int. Cl.
*H01L 29/786* (2006.01)
*H01L 29/04* (2006.01)
*H01L 29/423* (2006.01)
*H01L 29/20* (2006.01)
*B82Y 10/00* (2011.01)
*H01L 29/775* (2006.01)
*H01L 29/78* (2006.01)
*H01L 29/08* (2006.01)
*H01L 21/762* (2006.01)
*H01L 21/306* (2006.01)
*H01L 21/308* (2006.01)
*H01L 21/02* (2006.01)
*H01L 21/265* (2006.01)
*H01L 21/8258* (2006.01)

(52) U.S. Cl.
CPC ...... *H01L 29/0673* (2013.01); *H01L 29/0847* (2013.01); *H01L 29/20* (2013.01); *H01L 29/42384* (2013.01); *H01L 29/42392* (2013.01); *H01L 29/66469* (2013.01); *H01L 29/775* (2013.01); *H01L 29/7853* (2013.01); *H01L 29/78681* (2013.01); *H01L 29/78696* (2013.01); *H01L 21/3083* (2013.01); *H01L 21/30608* (2013.01); *H01L 21/8258* (2013.01)

(56) References Cited

U.S. PATENT DOCUMENTS

| | | | |
|---|---|---|---|
| 8,932,940 | B2 | 1/2015 | Wang et al. |
| 8,962,453 | B2 | 2/2015 | Wunnicke et al. |
| 9,698,239 | B2 | 7/2017 | Lee |
| 9,859,397 | B2 | 1/2018 | Lee |
| 10,103,242 | B2 * | 10/2018 | Lee ............... H01L 29/0673 |
| 2004/0188705 | A1 | 9/2004 | Yeo et al. |
| 2006/0284218 | A1 | 12/2006 | Kaner et al. |
| 2008/0041814 | A1 | 2/2008 | Romano et al. |
| 2008/0150165 | A1 | 6/2008 | Stumbo et al. |
| 2009/0078929 | A1 | 3/2009 | Getty |
| 2011/0233512 | A1 | 9/2011 | Yang et al. |
| 2013/0178019 | A1 * | 7/2013 | Bangsaruntip .... H01L 29/42392 438/149 |
| 2015/0179798 | A1 | 6/2015 | Clendenning et al. |
| 2016/0343804 | A1 | 11/2016 | Huang et al. |

FOREIGN PATENT DOCUMENTS

JP 5655228 B2 1/2015
WO WO 2013095341 6/2013

* cited by examiner

GROWING GROUPS III-V LATERAL NANOWIRE CHANNELS

FIELD OF THE DISCLOSURE

The present disclosure relates generally to semiconductor devices and relates more specifically to field effect transistors fabricated in accordance with complementary metal-oxide-semiconductor technology and including laterally grown nanowire channels.

BACKGROUND OF THE DISCLOSURE

Groups III-V semiconductor materials have been shown to be superior to silicon for particular applications, including, for example, optoelectronic applications. In such applications, a layer of a Group III-V material may be grown over a semiconductor substrate in a pillar shape, with a narrow diameter and a height which is sufficiently long compared the diameter. When the diameter of the Group III-V material is narrowed to a few tens of nanometers, the resultant structure may be referred to as a "nanowire."

SUMMARY OF THE DISCLOSURE

In one example, a method for fabricating a semiconductor device includes forming a mandrel comprising silicon. Sidewalls of the silicon are orientated normal to the <111> direction of the silicon. A nanowire is grown directly on at least one of the sidewalls of the silicon and is formed from a material selected from Groups III-V. Only one end of the nanowire directly contacts the silicon.

In another example, a method for fabricating a semiconductor device includes forming a mandrel. The mandrel comprises a layer of silicon and a mask layer formed directly on the layer of silicon. A growth mask is deposited directly on the mandrel, and a photoresist layer is deposited directly on the growth mask. The photoresist layer is patterned, resulting in the removal of a portion of the photoresist layer. Portions of the growth mask that resided directly beneath the removed portion of the photoresist layer are then etched to expose a portion of the sidewalls. A nanowire is grown directly on the portion of the sidewalls. The nanowire is formed from a material selected from Groups III-V, and only one end of the nanowire directly contacts the layer of silicon.

In another example, a semiconductor device includes a mandrel comprising silicon. The sidewalls of the silicon are orientated normal to a <111> direction of the silicon. A nanowire is grown directly on at least one of the sidewalls. The nanowire is formed from a material selected from Groups III-V, and only one end of the nanowire directly contacts the silicon.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In one example, a method for growing Groups III-V lateral nanowire channels is disclosed. Semiconductor materials such as Groups III-V materials have been used to form nanowire channels in field effect transistors (FETs). These channels are grown in a manner that results in the channels being orientated vertically relative to the substrate surface. From a complementary metal-oxide-semiconductor (CMOS) integration point of view, this approach presents several challenges. For example, epitaxial growth of Groups III-V semiconductors on silicon may be complicated by lattice mismatch, differences in crystal structure, and/or differences in thermal expansion coefficients, among other complications.

Examples of the present disclosure grow Group III-V lateral nanowire channels in a manner that is compatible with CMOS integration. In one example, the nanowires are grown laterally on a sidewall of a silicon mandrel. By limiting the growth area to the sidewall, nanowire channels can be formed in a manner that is easier to incorporate into existing CMOS integration schemes than vertically orientated channels.

FIGS. 1A-1H illustrate a semiconductor device 100 during various stages of a first fabrication process performed according to examples of the present disclosure. As such, when viewed in sequence, 1A-1H also serve as a flow diagram for the first fabrication process. In particular, FIGS. 1A-1H illustrate isometric views of the semiconductor device 100 during the various stages of the first fabrication process.

Figure 1A:
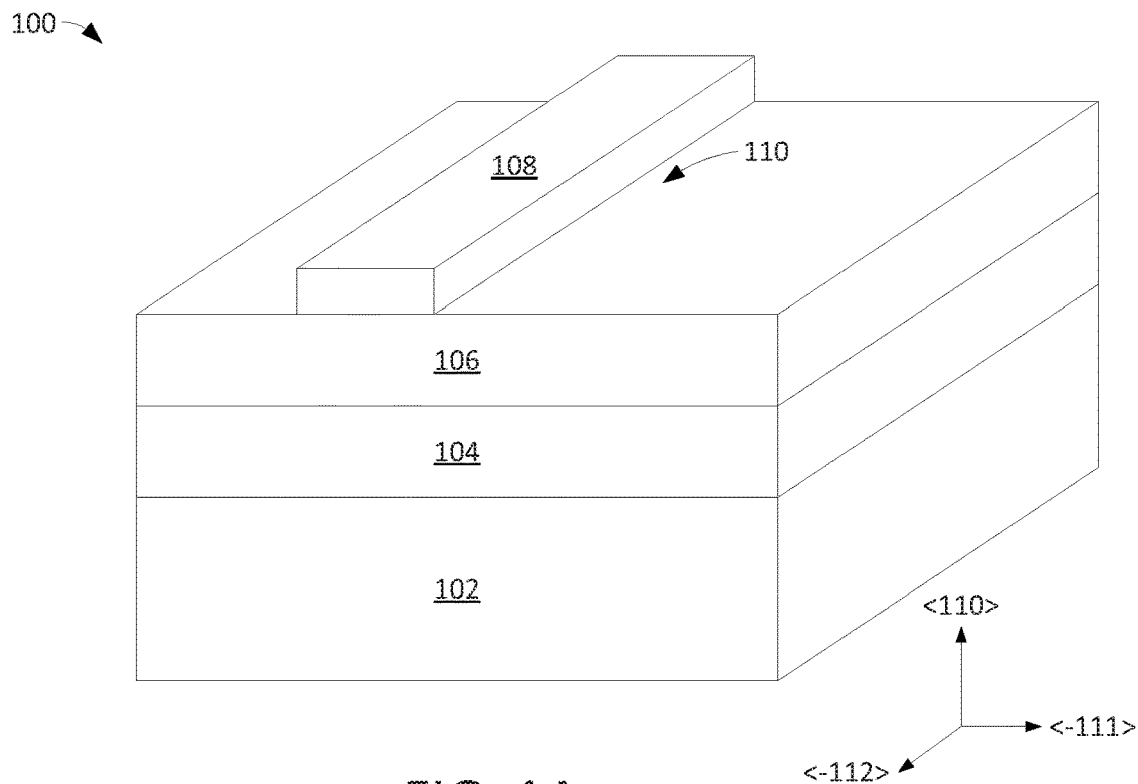
FIGS. 1A-1H illustrate a semiconductor device during various stages of a first fabrication process performed according to examples of the present disclosure.

Referring to FIG. 1A, one example of the semiconductor device 100 begins as a substrate 102, formed, for example, from bulk silicon (Si). A buried oxide (BOX) layer 104 is formed directly on the substrate 102. A silicon layer 106 is formed directly on the buried oxide layer 104. The silicon layer 106 may be formed, for example, from a bulk silicon wafer or a silicon-on-insulator (SOI) wafer. In one example, the silicon layer 106, whether formed from bulk silicon or SOI, is a (110) silicon wafer (i.e., the wafer is flat in the <110> direction, as illustrated by the coordinate axes). An etch mask 108 is formed directly on the silicon layer 106. The etch mask 108 may be formed, for example, from silicon dioxide (Sift), silicon nitride ($SiN_x$), or aluminum oxide ($Al_2O_3$). FIG. 1A illustrates the semiconductor device 100 after patterning of the etch mask 108, which may be performed using a dry etch process and results in the removal of a portion of the etch mask 108 down to the silicon layer 106. The patterning defines dimensions of at least one mandrel 110 formed partially of the etch mask material (only one mandrel 110 is illustrated in FIG. 1A for clarity). The mandrel 110 is orientated such that its longest dimension is parallel to the <112> direction of the silicon layer 106, as illustrated by the coordinate axes.

Figure 1B:
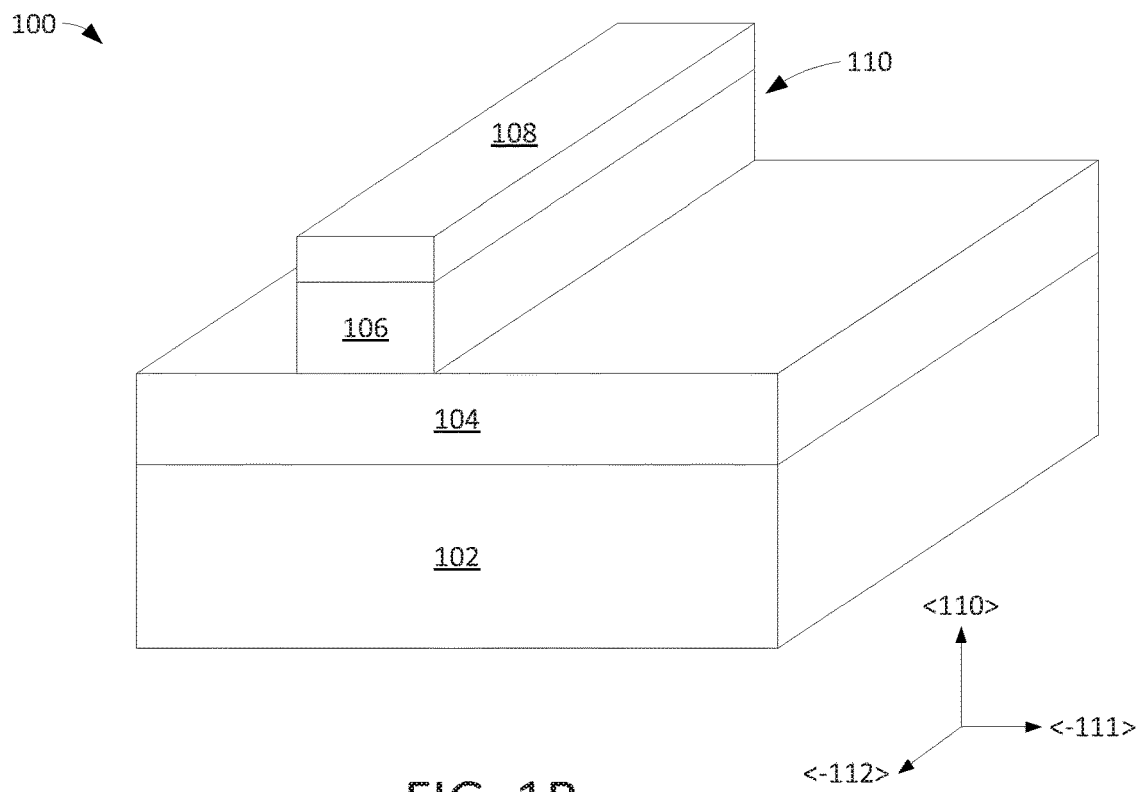

As illustrated in FIG. 1B, the silicon layer 106 is next etched, for example using an anisotropic wet etch process (using, for instance, potassium hydroxide or tetramethylammonium hydroxide). In one example, etching of the silicon layer 106 results in the removal of any portions of the silicon layer 106 that do not reside directly beneath the etch mask 108. As a result, the mandrel 110 whose dimensions were defined in FIG. 1A includes both a portion of the etch mask 108 and a portion of the silicon layer 106. The silicon portion of the mandrel 110 has a vertical sidewall that is orientated in a manner that is normal to the <111> direction of the silicon layer 106, as illustrated by the coordinate axes. The vertical sidewall has an atomically flat surface due to the facet-selective nature of the etching process.

Figure 1C:
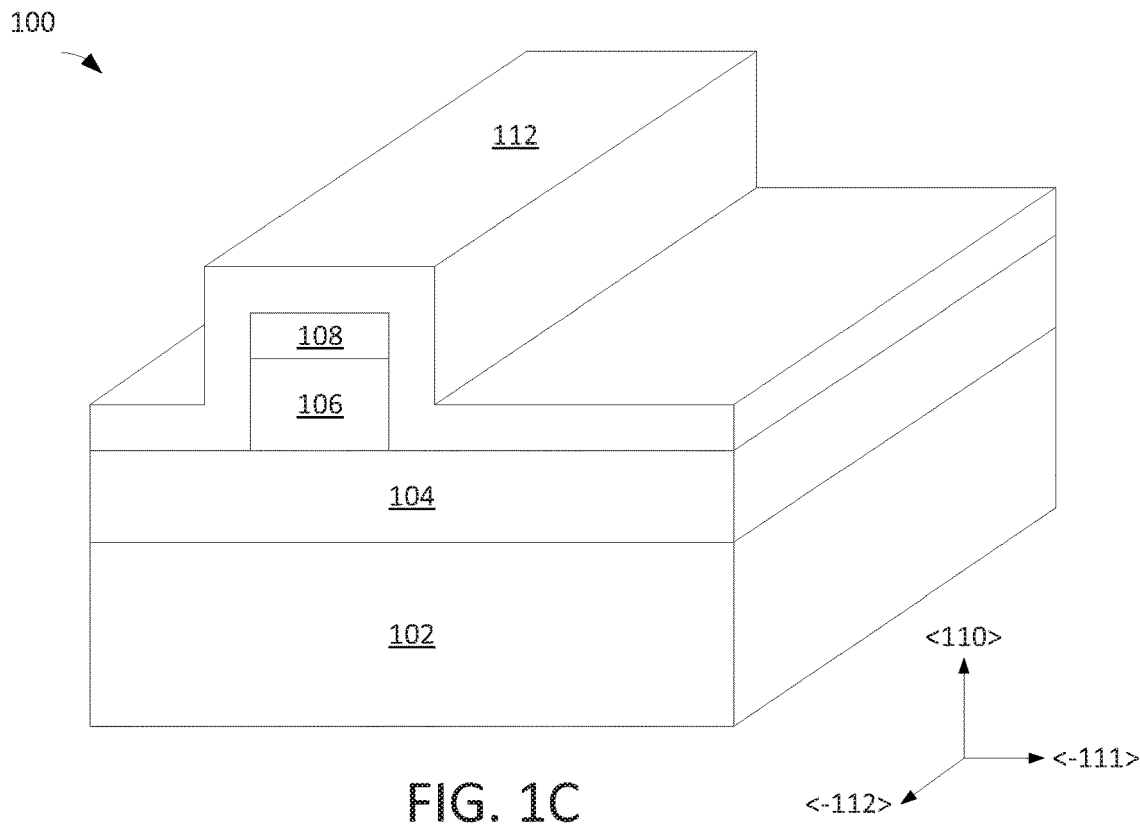

As illustrated in FIG. 1C, a growth mask 112 is next deposited over the semiconductor device 100, directly on the buried oxide layer 104 and the mandrel 110. The growth mask may be formed, for example, from an oxide.

Figure 1D:
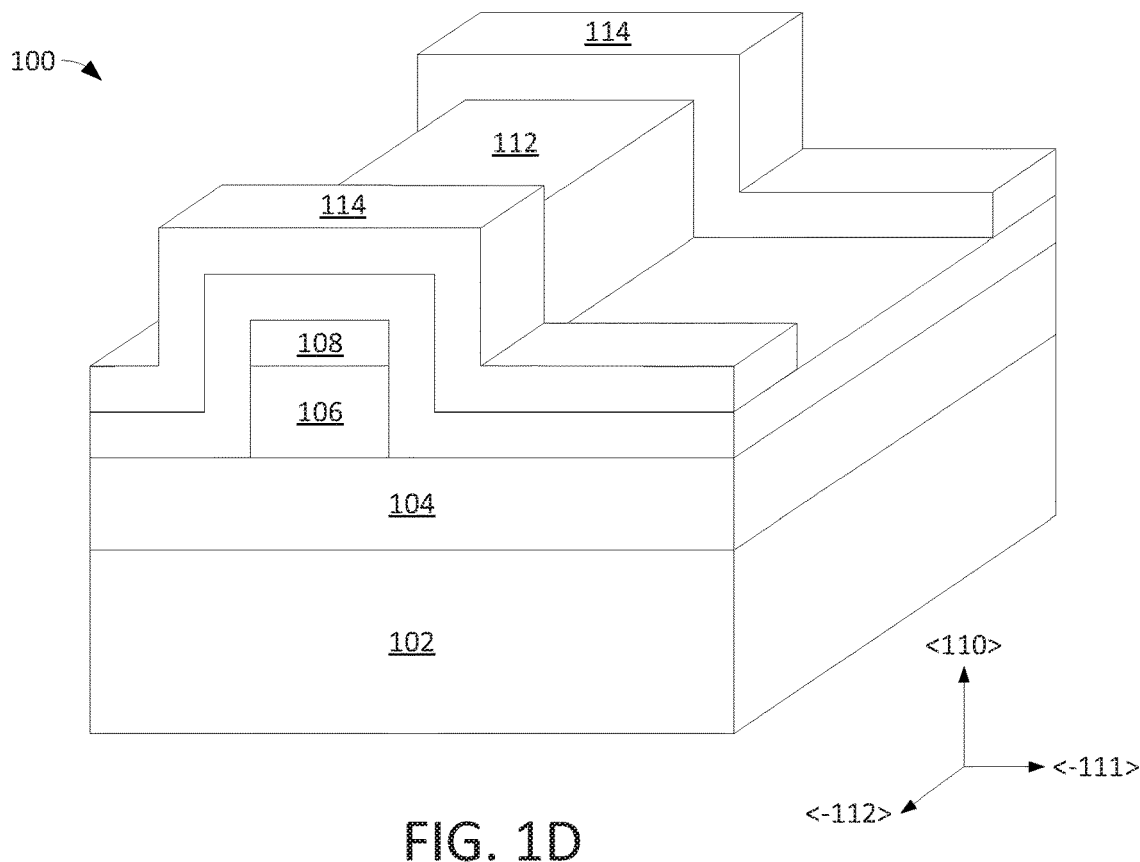

As illustrated in FIG. 1D, a photoresist layer 114 is next deposited directly on the growth mask 112. FIG. 1D illustrates the semiconductor device 100 after patterning of the photoresist layer 114, which results in the removal of a portion of the photoresist layer 114 down to the growth mask 112.

Figure 1E:
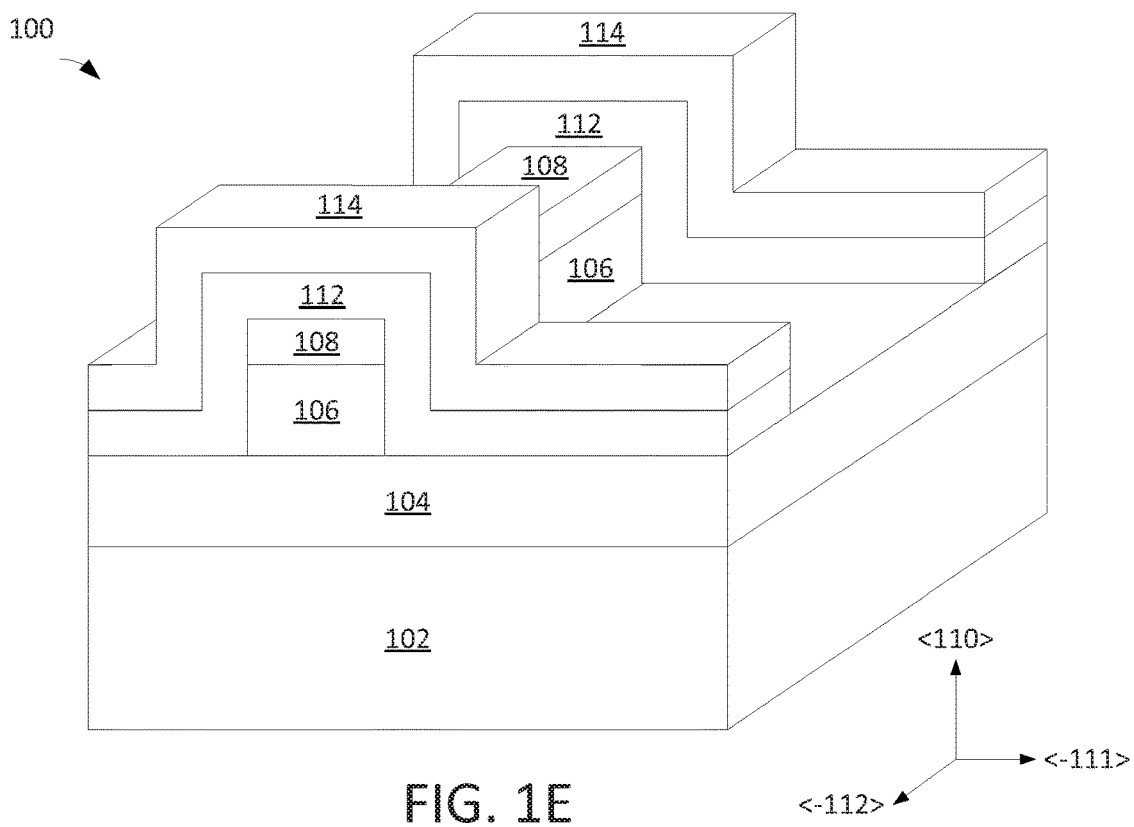

As illustrated in FIG. 1E, the portions of the growth mask 112 that do not reside directly beneath the photoresist layer 114 are next etched down to the buried oxide layer 104, for example using a wet etch process. Etching of the growth mask results in the exposure of a portion of the sidewalls of the silicon layer 106 and the etch mask 108, as illustrated.

Figure 1F:
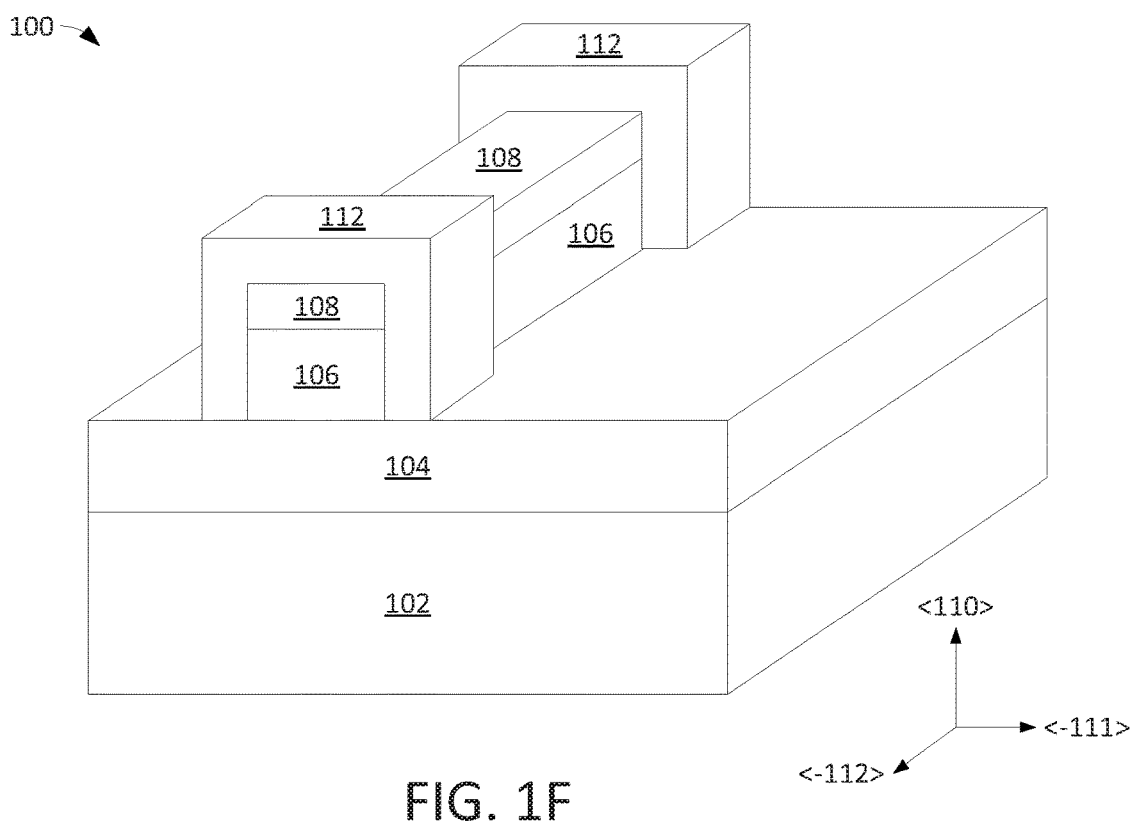

As illustrated in FIG. 1F, the photoresist layer 114 is next removed entirely. In addition, a portion of the growth mask 112 (i.e., the portion of the growth mask 112 that does not directly contact the silicon layer 106 or the etch mask 108) is optionally also removed.

Figure 1G:
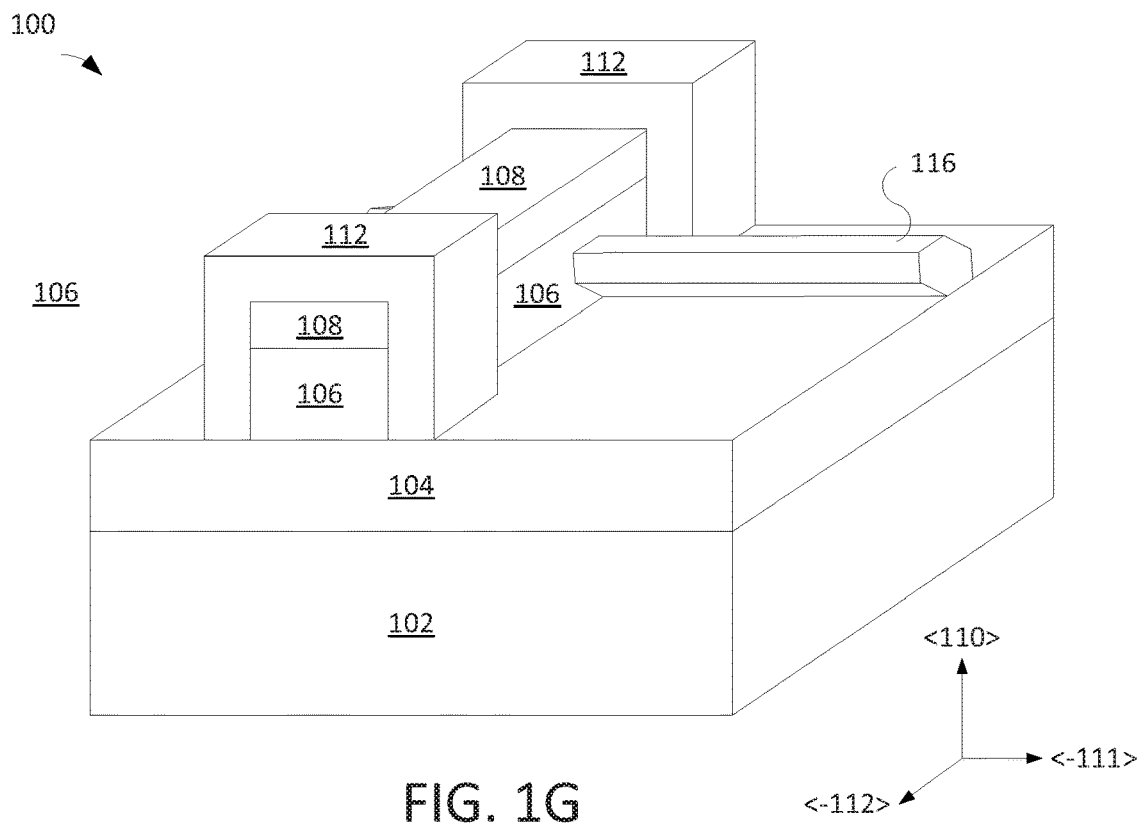

As illustrated in FIG. 1G, an epitaxial nanowire 116 is next grown laterally, i.e., on the sidewall of the silicon layer 106. In one example, the nanowire 116 comprises a material selected from Groups III-V. In one example, the nanowire 116 is grown only on the sidewall of the silicon layer 106, and the longest dimension of the nanowire 116 is parallel to the <111> direction of the silicon layer 106, as illustrated by the coordinate axes. Thus, growth is significantly greater in the <111> direction than it is in the <110> and <112> directions (or in the directions normal to the <111> direction). The nanowire 116 may be grown on both sidewalls of the silicon layer 106, as illustrated; however, only one end of each segment of the nanowire 116 contacts the silicon layer 106. Although only one nanowire 116 is illustrated in FIG. 1G, any number of nanowires 116 may be similarly formed, with high density and small pitch.

Figure 1H:
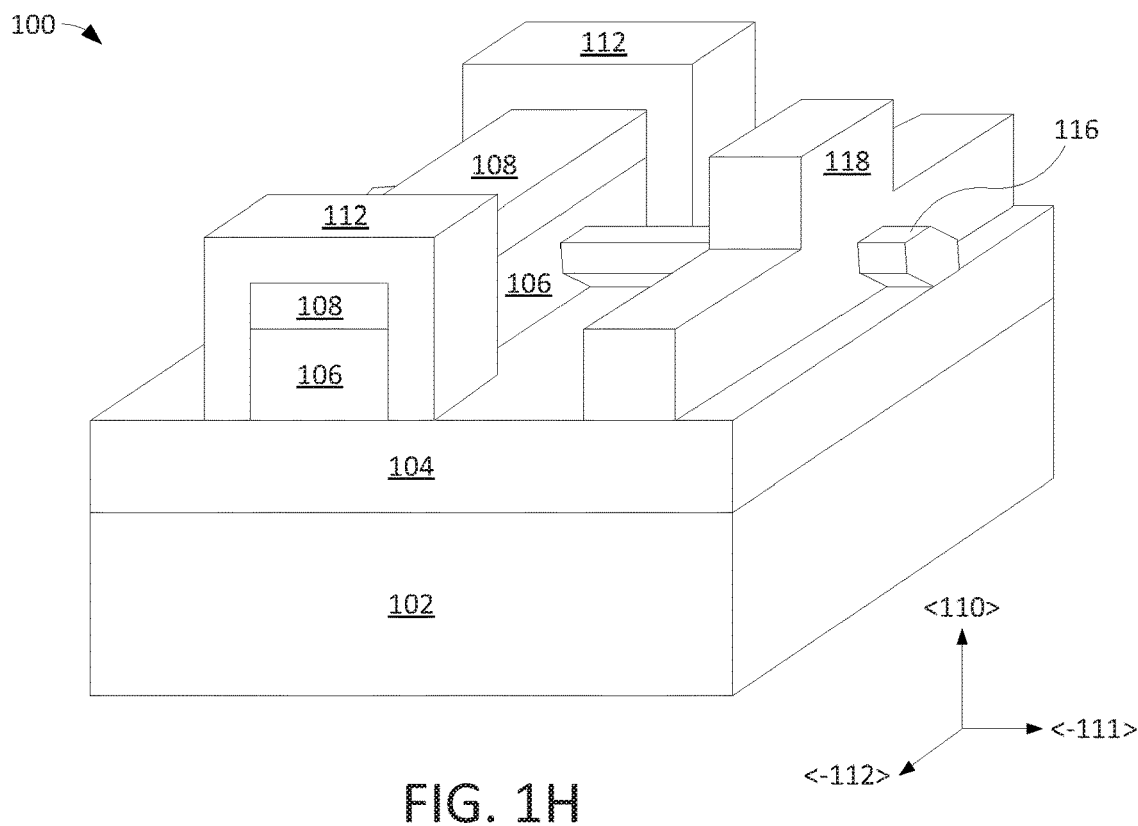

As illustrated in FIG. 1H, a metal gate 118 is next formed on the nanowire 116. Thus, the portion of the nanowire 116 residing directly beneath the metal gate 118 functions as a conducting channel. The metal gate 118 may be formed from a high-k metal. The portions of the nanowire 116 residing on either side of the gate are modified, e.g., via ion-implantation or epitaxy, to function as source and drain regions.

The resultant nanowires may thus form the conducting channels of a transistor. Thus, Groups III-V semiconductor nanowire channels may be grown directly on a silicon surface orientated normal to the surface of the device substrate. As discussed above, this results in nanowires whose longest dimension is parallel to the <111> direction of the silicon surface, i.e., nanowire growth is significantly greater in the <111> direction than it is in the <110> direction. This allows multiple nanowires to be grown with high density and low pitch, maximizing use of device space.

The process illustrated in FIGS. 1A-1H may be modified. FIGS. 2A-2D, for instance, illustrate a semiconductor device 200 during various stages of a second fabrication process performed according to examples of the present disclosure. As such, when viewed in sequence, 2A-2D also serve as a flow diagram for the second fabrication process. In particular, FIGS. 2A-2D illustrate isometric views of the semiconductor device 200 during the various stages of the second fabrication process.

Figure 2A:
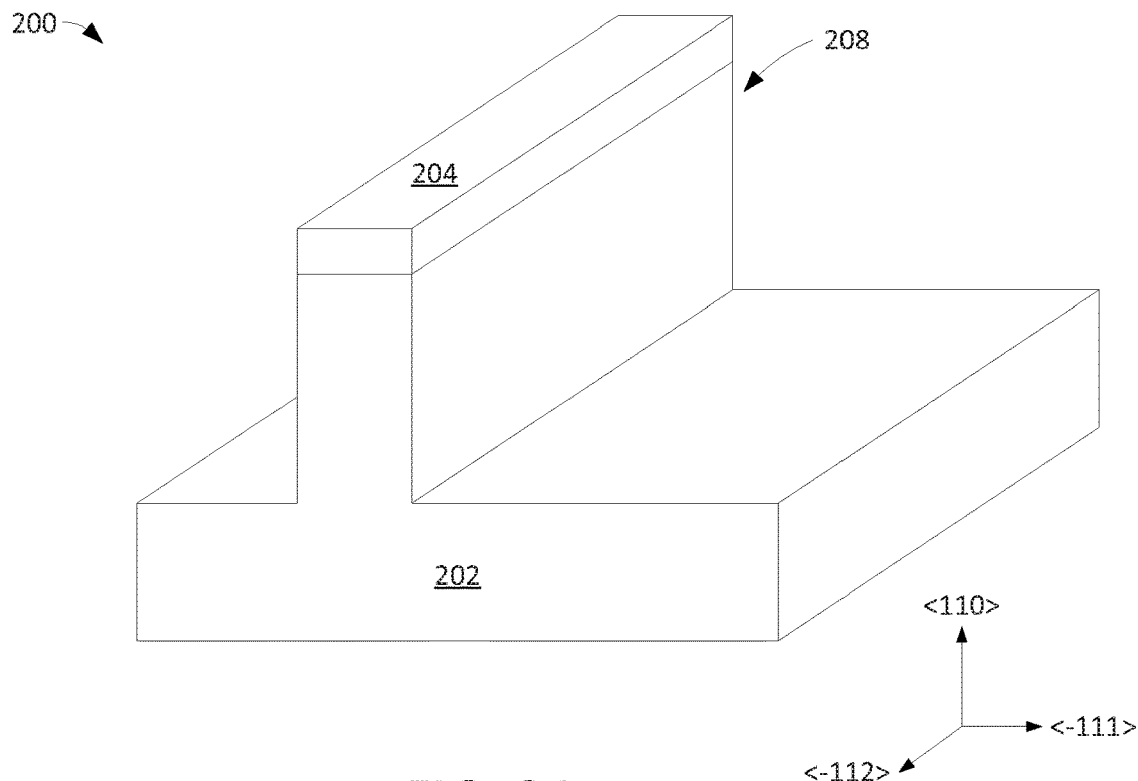
FIGS. 2A-2D illustrate a semiconductor device during various stages of a second fabrication process performed according to examples of the present disclosure.

As illustrated in FIG. 2A, rather than start with a silicon substrate and bulk oxide layer, the semiconductor device 200 simply starts with a bulk silicon wafer 202. In one example, the wafer 202 is a (110) silicon wafer (i.e., the wafer 202 is flat in the <110> direction, as illustrated by the coordinate axes). An etch mask 204 is deposited directly on the wafer 202 and is patterned, similar to the process illustrated in FIG. 1A. The etch mask 204 may be formed, for example, from silicon nitride ($SiN_x$). The wafer 202 is next partially etched, for example using an anisotropic wet etch process (using, for instance, potassium hydroxide or tetramethylammonium hydroxide). In one example, etching of the wafer 202 results in the removal of some (but not all) portions of the wafer 202 that do not reside directly beneath the etch mask 204. As a result, a mandrel 208 formed in FIG. 2A that includes both a portion of the etch mask 204 and a portion of the wafer 202. The silicon portion of the mandrel 110 has a vertical sidewall that is orientated in a manner that is normal to the <111> direction of the wafer 202, as illustrated by the coordinate axes. The vertical sidewall has an atomically flat surface due to the facet-selective nature of the etching process. Thus, the result of this process is similar to the result illustrated in FIG. 1B (without the substrate 102 and buried oxide layer 104).

Figure 2B:
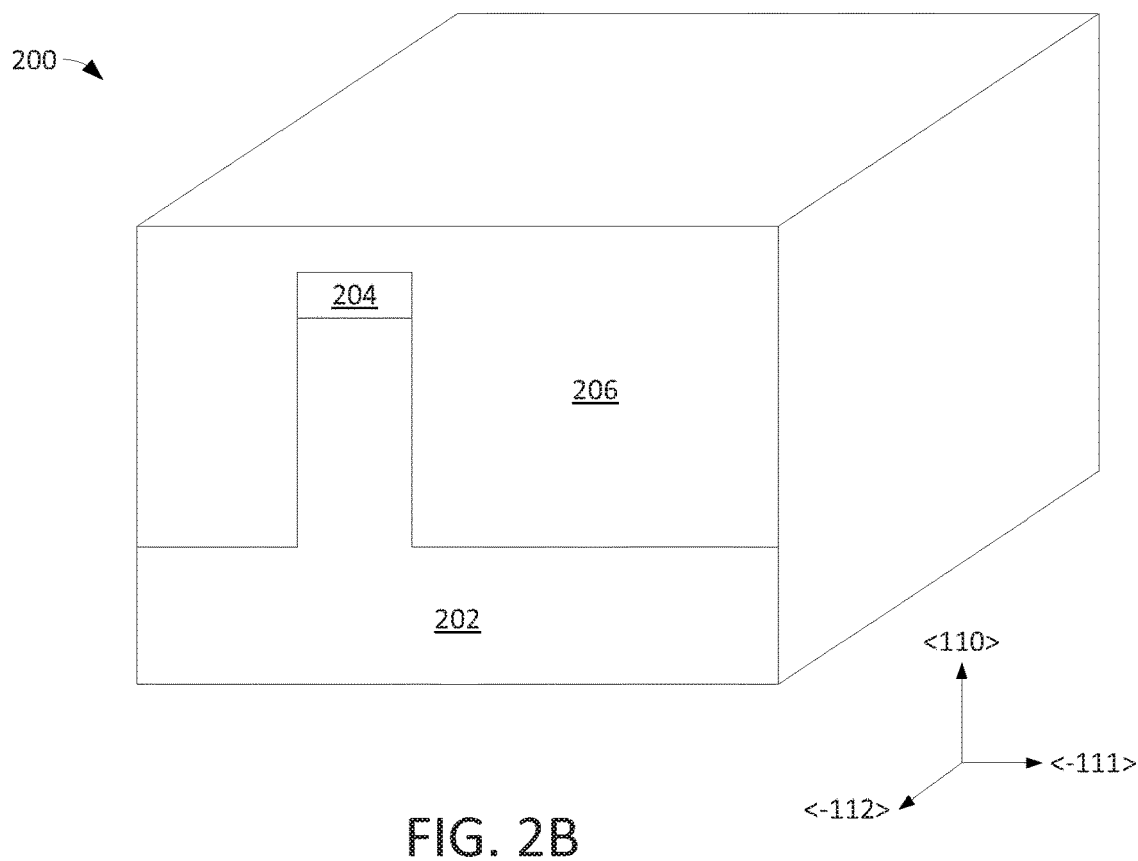

As illustrated in FIG. 2B, an oxide layer 206 is next deposited directly on the wafer 202 and etch mask 204. The oxide layer may comprise, for example, silicon dioxide ($SiO_2$).

Figure 2C:
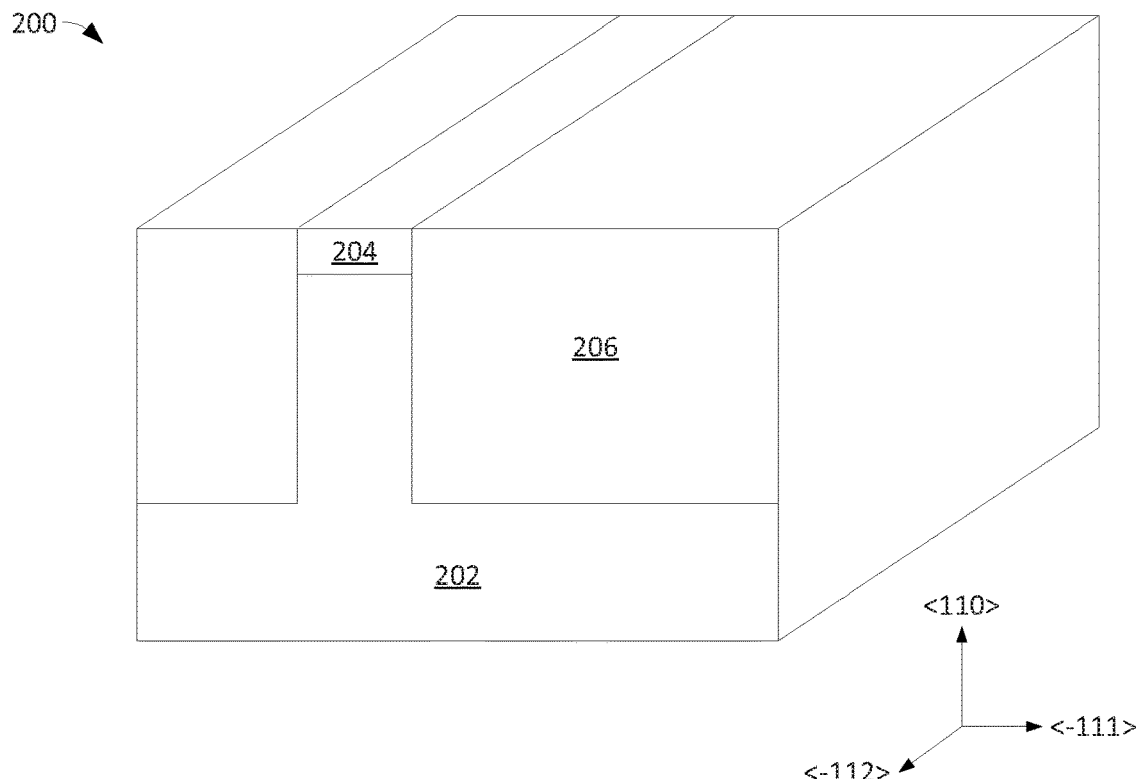

As illustrated in FIG. 2C, the oxide layer 206 is next polished down to the etch mask 204.

Figure 2D:
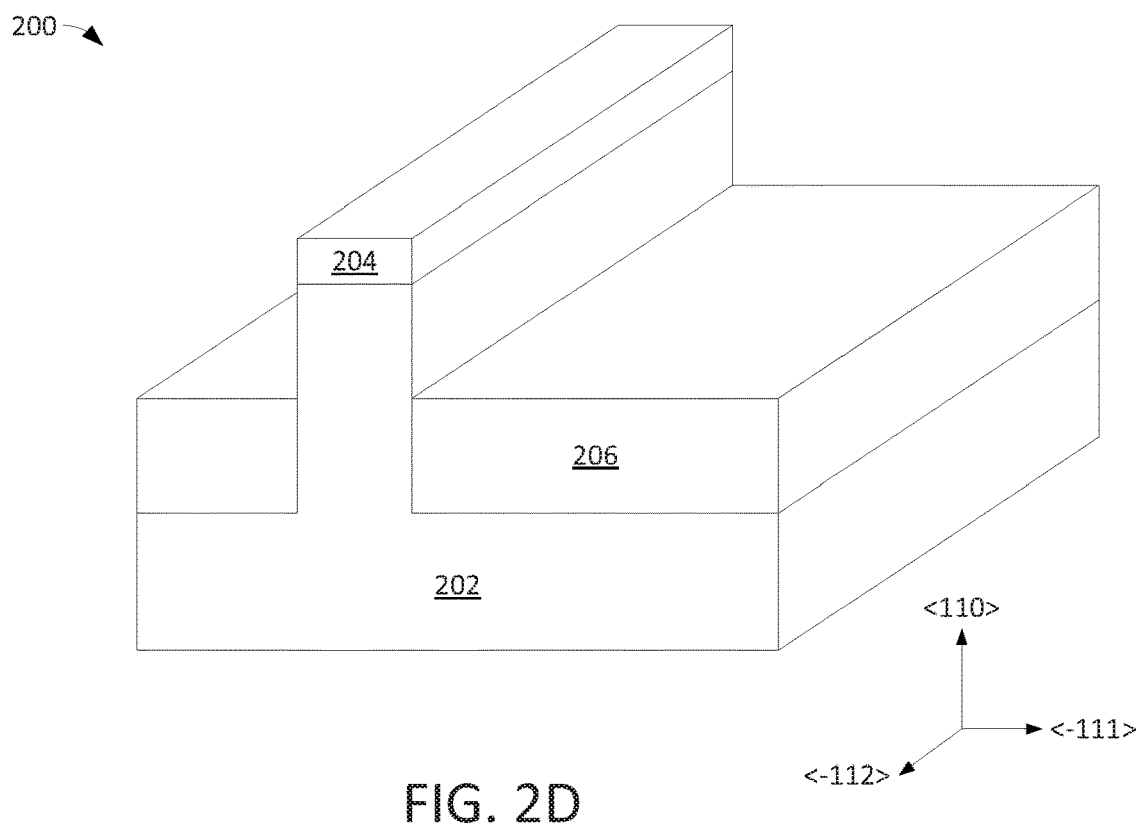

As illustrated in FIG. 2D, the oxide layer 206 is next partially etched to expose the silicon sidewalls of the mandrel 208. Further fabrication of the semiconductor device 200 may now proceed in a manner similar to that described above in connection with FIGS. 1C-1H. Thus, the process illustrated in FIGS. 2A-2D is an alternative to the process illustrated in FIGS. 1A-1B.

Figure 3:
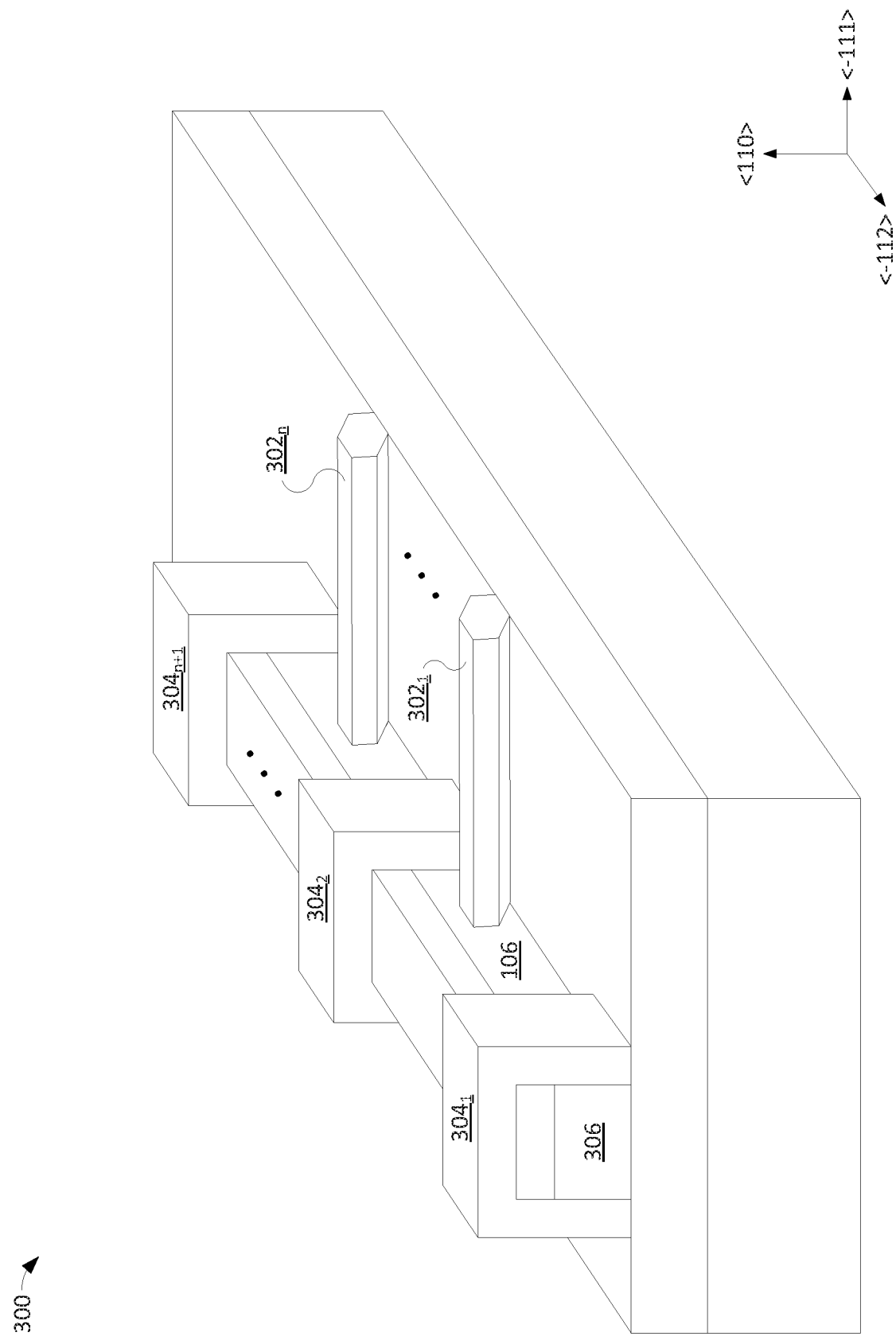
FIG. 3 illustrates an isometric view of a semiconductor device including multiple laterally grown nanowire channels.

The process illustrated in FIGS. 1A-1H (optionally substituting the process illustrated in FIGS. 2A-2D for that illustrated in FIGS. 1A-1B) may be used to fabricate any number of semiconductor nanowire channels. FIG. 3, for example, illustrates an isometric view of a semiconductor device 300 including multiple laterally grown nanowire channels $302_1$-$302_n$ (hereinafter collectively referred to as "nanowire channels 302"). In this example, the nanowire channels 302 are physically separated along the <112> direction of the silicon 306 by oxide regions $304_1$-$304_{n+1}$ (hereinafter collectively referred to as "oxide regions 304"). The oxide regions 304 may comprise, for example, the growth mask 112 discussed in connection with FIGS. 1A-1H.

Although various embodiments which incorporate the teachings of the present invention have been shown and described in detail herein, those skilled in the art can readily devise many other varied embodiments that still incorporate these teachings.

What is claimed is:
1. A semiconductor device, comprising:
   a mandrel comprising silicon;
   a nanowire formed from a material selected from Groups III-V that is grown directly on a sidewall of the mandrel, wherein a first end of the nanowire directly contacts the silicon of the mandrel and a second end of the nanowire avoids direct contact with silicon; and a metal gate positioned over a portion of the nanowire, wherein portions of the nanowire over which the metal gate is not positioned are modified by ion-implantation to create source and drain regions.

2. The semiconductor device of claim 1, wherein the silicon comprises (110) silicon.

3. The semiconductor device of claim 2, wherein the sidewall of the mandrel is orientated normal to a <111> direction of the silicon.

4. The semiconductor device of claim 3, wherein a longest dimension of the nanowire is parallel to the <111> direction of the silicon.

5. The semiconductor device of claim 3, wherein a longest dimension of the mandrel is orientated parallel to a <112> direction of the silicon.

6. The semiconductor device of claim 3, wherein the nanowire is one of a plurality of nanowires grown directly on the sidewall of the mandrel, and nanowires in the plurality of nanowires are physically separated along the <112> direction of the silicon by one or more oxide regions.

7. The semiconductor device of claim 1, wherein the nanowire forms a conducting channel of the semiconductor device.

8. The semiconductor device of claim 1, wherein the semiconductor device is part of an optoelectronic device.

9. The semiconductor device of claim 1, wherein the semiconductor device is part of a transistor.

10. The semiconductor device of claim 1, wherein the sidewall of the mandrel has an atomically flat surface.

11. The semiconductor device of claim 1, wherein the nanowire is grown epitaxially on the sidewall of the mandrel.

12. The semiconductor device of claim 1, wherein the first end of the nanowire is formed from the material selected from Groups III-V.

* * * * *